[](US009711431B2)

(12) United States Patent
Lin

(10) Patent No.: US 9,711,431 B2
(45) Date of Patent: Jul. 18, 2017

(54) ADJUSTABLE FASTENING BRACKET FOR RADIATOR

(71) Applicant: ABLECOM TECHNOLOGY INC., New Taipei (TW)

(72) Inventor: Chen-Tang Lin, New Taipei (TW)

(73) Assignee: ABLECOM TECHNOLOGY INC., New Taipei (TW)

( * ) Notice: Subject to any disclaimer, the term of this patent is extended or adjusted under 35 U.S.C. 154(b) by 109 days.

(21) Appl. No.: 14/690,789

(22) Filed: Apr. 20, 2015

(65) Prior Publication Data

US 2016/0307820 A1     Oct. 20, 2016

(51) Int. Cl.
*F16M 1/00*     (2006.01)
*H01L 23/40*     (2006.01)

(52) U.S. Cl.
CPC .. *H01L 23/4006* (2013.01); *H01L 2023/4081* (2013.01); *H01L 2023/4087* (2013.01)

(58) Field of Classification Search
CPC ..... H01L 2023/4087; H01L 2023/4081; F16B 5/0036; F16B 12/22; F16B 21/09; Y10T 403/32581
USPC ......... 248/670, 673, 172, 346.07, 354.1, 94, 248/222.41, 220.2, 674, 635, 544, 678, 248/220.21; 361/704, 719, 649.47; 411/104, 107
See application file for complete search history.

(56) References Cited

U.S. PATENT DOCUMENTS

| | | | | |
|---|---|---|---|---|
| 1,072,526 A * | 9/1913 | Stiles | ...................... | A47C 3/021 248/628 |
| 1,684,925 A * | 9/1928 | Perlmutter | .............. | F21V 21/06 248/346.07 |
| 1,780,872 A * | 11/1930 | Dumben | ................ | A47B 65/00 108/28 |
| 2,695,105 A * | 11/1954 | Mitchell | ................ | A47B 61/04 211/35 |
| 2,853,113 A * | 9/1958 | Balint | ...................... | F16B 21/09 411/103 |
| 3,049,369 A * | 8/1962 | Trafton | ................... | F16B 5/125 24/290 |
| 3,487,945 A * | 1/1970 | Barham | ................. | A47B 65/00 211/184 |
| 4,118,002 A * | 10/1978 | Bartlett | .................... | A47L 11/34 15/321 |
| 4,270,591 A * | 6/1981 | Gill | ........................ | F16B 37/041 403/299 |
| 4,319,727 A * | 3/1982 | Rattay | .................... | A47G 7/041 248/149 |

(Continued)

*Primary Examiner* — Kimberly Wood

(57) ABSTRACT

An adjustable fastening bracket used in a radiator includes a supporting stand which includes a plate body provided with pluralities of combination grooves, each combination groove includes a through hole and a long through groove, at least one side of the long through groove away from the through hole is provided with at least one positioning recess; pluralities of positioning elements, each of which includes a positioning plate and a pair of elastic arms, a penetrating hole is provided on the positioning plate corresponding to the through hole, each elastic arm has a positioning convex part; pluralities of fixing elements, each of which penetrates the penetrating hole and the through hole to be disposed in each combination groove, and each fixing element drives the pair of elastic arms to make the positioning convex part of the pair of the elastic arms clip into any one of the positioning recesses.

18 Claims, 7 Drawing Sheets

(56) References Cited

U.S. PATENT DOCUMENTS

| | | | | |
|---|---|---|---|---|
| 4,458,874 A * | 7/1984 | Rabas | A47F 7/024 | 248/448 |
| 4,635,801 A * | 1/1987 | Oren | B25H 3/04 | 211/70.6 |
| 4,826,022 A * | 5/1989 | Duarte | A47F 5/0846 | 211/59.1 |
| 4,934,886 A * | 6/1990 | Aikens | B25B 31/00 | 29/453 |
| 5,032,034 A * | 7/1991 | Bischof | B41J 29/02 | 400/660 |
| 5,195,793 A * | 3/1993 | Maki | F16B 5/128 | 24/297 |
| 5,779,412 A * | 7/1998 | Nagai | E04B 2/766 | 411/104 |
| 5,823,727 A * | 10/1998 | Lee | F16B 37/045 | 411/107 |
| 6,040,514 A * | 3/2000 | Liao | G10D 13/026 | 248/127 |
| 6,146,071 A * | 11/2000 | Norkus | F16B 37/044 | 296/187.09 |
| 6,196,758 B1 * | 3/2001 | Scarborough | F16B 21/09 | 403/109.3 |
| 6,644,615 B1 * | 11/2003 | Liu | B66F 13/00 | 248/346.07 |
| 6,669,274 B2 * | 12/2003 | Barnard | B60R 19/52 | 296/193.1 |
| 6,823,997 B2 * | 11/2004 | Linden | A47F 5/005 | 211/175 |
| 7,180,743 B2 * | 2/2007 | Chen | H01L 23/4093 | 165/185 |
| 7,283,368 B2 * | 10/2007 | Wung | H01L 23/4093 | 165/185 |
| 7,527,464 B2 * | 5/2009 | Stewart | F16B 21/09 | 411/107 |
| 7,764,503 B2 * | 7/2010 | Zha | G06F 1/20 | 165/121 |
| 8,902,580 B2 * | 12/2014 | Zhou | H01L 23/36 | 165/80.3 |
| 8,967,586 B2 * | 3/2015 | Zhu | F28F 3/06 | 165/104.33 |
| 2006/0120796 A1 * | 6/2006 | Kobayashi | F16B 21/09 | 403/14 |
| 2006/0179785 A1 * | 8/2006 | Stewart | F16B 21/09 | 52/699 |
| 2008/0130233 A1 * | 6/2008 | Jin | H01L 23/4006 | 361/704 |
| 2009/0272872 A1 * | 11/2009 | Hoffman | F16F 1/3732 | 248/673 |
| 2011/0194910 A1 * | 8/2011 | Lin | F16B 5/02 | 411/172 |

* cited by examiner

ADJUSTABLE FASTENING BRACKET FOR RADIATOR

BACKGROUND

1. Technical Field

The present disclosure relates to an adjustable bracket, particularly to an adjustable bracket capable of adjusting the position of a fixing element.

2. Related Art

By improving the function and performance of the electronic product, the calculation speed of the electronic element has been improved, and the heat generated by the electronic element is increased as well. Thus, most of today's electronic elements are equipped with a heat dissipating device to control the working temperature and maintain the normal operation of the electronic elements.

Moreover, today's heat dissipating devices usually need a fixing frame with different dimensions when dissipating heat for electronic elements with different sizes, thereby fixing the heat dissipating device to cool down the electronic elements. However, it is time consuming and laborious to install a fixing frame with various dimensions, as well as increasing the cost, which does not fulfill the requirement.

BRIEF SUMMARY

The purpose of a preferred embodiment of the present disclosure is to provide an adjustable fastening bracket used in a radiator. The adjustable fastening bracket fixes the radiator and is connected to the radiator by adjusting the position of the fixing element, so as to dissipate heat for the electronic elements with different dimensions.

Another purpose of the preferred embodiment of the present disclosure is to provide an adjustable fastening bracket used in a radiator. The position of the fixing element of the adjustable fastening bracket is easy to be adjusted, thereby increasing convenience of assembly.

In order to achieve the aforementioned goal, the preferred embodiment of the present disclosure provides an adjustable fastening bracket used in a radiator to fix the radiator and dissipate heat from an electronic element. The adjustable fastening bracket includes a supporting stand, a plurality of positioning elements, and a plurality of fixing elements. The supporting stand includes a plate body, which is provided with a plurality of combination grooves. Each combination groove includes a through hole and a long through groove communicating the through hole, and at least one side of the long through groove away from the through hole is provided with at least one positioning recess. Each of the plurality of positioning elements includes a positioning plate and a pair of elastic arms connecting the positioning plate. A penetrating hole is provided on the positioning plate corresponding to the through hole, and each elastic arm has a positioning convex part. Each of the plurality of fixing elements penetrates the penetrating hole and the through hole to be disposed in each of the combination grooves. Each of the plurality of fixing elements drives the pair of elastic arms to move from the through hole toward a direction of the at least one positioning recess, thereby positioning the convex part of the pair of the elastic arms for clipping into any one of the positioning recesses.

Still another purpose of the preferred embodiment of the present disclosure is to provide an adjustable fastening bracket used in a radiator, wherein the positioning element is provided with a buckle protruded from a surface thereof. When the fixing element is accommodated in the combination groove, the buckle will be against one side of the through hole so as to prevent the fixing element from falling out from the through hole, thereby avoiding the missing or dropping of the fixing element during the assembly or position-adjusting process, and also improving the convenience of the assembly.

Compared to the conventional structure, the adjustable fastening bracket includes a supporting stand and a plurality of positioning elements and a plurality of fixing elements connected to the supporting stand. Besides, the fixation position of the fixing element on the supporting stand can be changed by adjusting the positioning position. Therefore, the electronic elements of different sizes and different fixation positions can be connected to the supporting stand according to the preferred embodiment of the present disclosure by changing the fixation position of the fixing element. In addition, the fixing element of the preferred embodiment of the present disclosure can adjust the fixing position by moving forward or backward. Moreover, the buckle of the positioning element will be against one side of the through hole in order to prevent the fixing element from dropping out of the through hole, thereby avoiding the missing or dropping of the fixing element during the assembly or position-adjusting procedure, and also increasing the convenience of the assembly.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
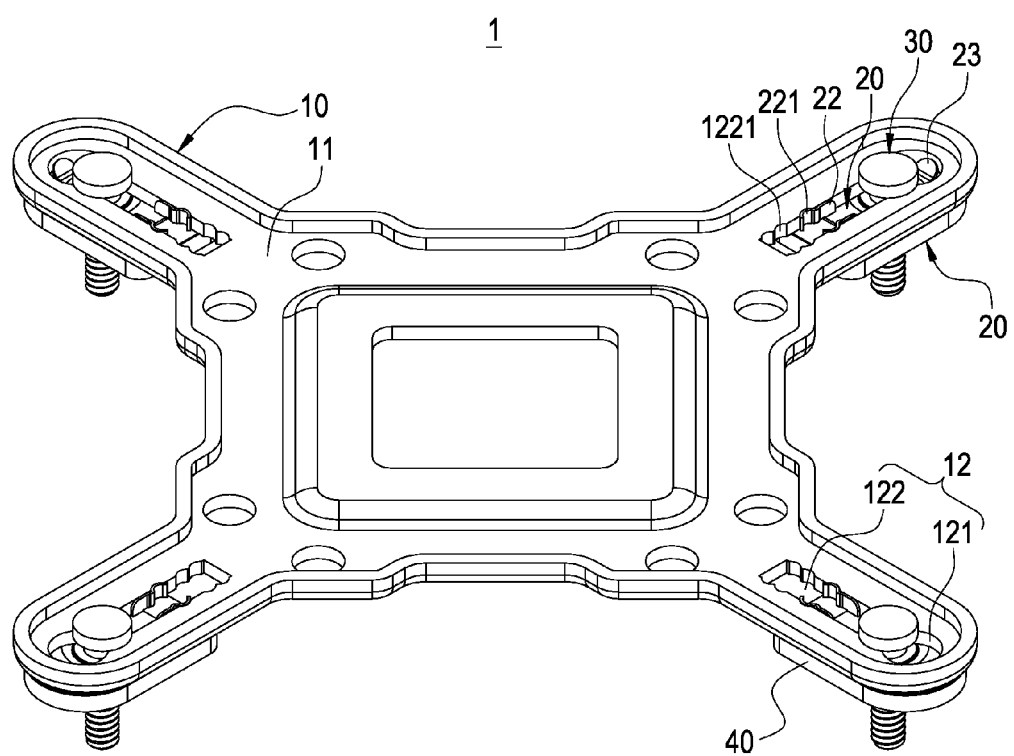
FIG. 1 is a perspective schematic view of a preferred embodiment from a side direction of the adjustable fastening bracket used in a radiator according to the present disclosure.
Figure 2:
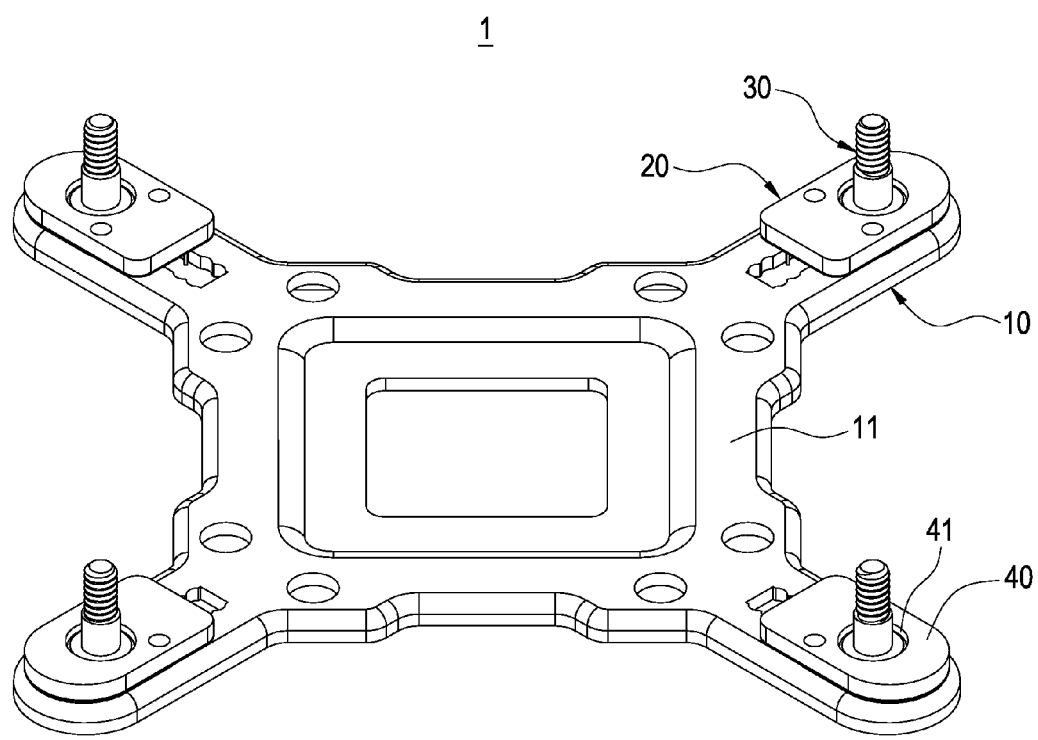
FIG. 2 is a perspective schematic view of a preferred embodiment from another side direction of the adjustable fastening bracket used in a radiator according to the present disclosure.

Referring to FIGS. 1-4, the adjustable fastening bracket 1 according to the preferred embodiment of the present disclosure includes a supporting stand 10, a plurality of positioning elements 20, and a plurality of fixing elements 30. The plurality of positioning elements 20 and the plurality of fixing elements 30 are connected to the supporting stand 10.

The supporting stand 10 is connected to a fixed position by the fixing element 30. The fixed position of the fixing element 30 relative to the supporting stand 10 can be changed by adjusting the positioning position of the positioning element 20. In the present embodiment, the fixing element 30 is a screw fixing element, but not limited thereto.

The supporting stand 10 includes a plate body 11. The plate body 11 is provided with a plurality of combination grooves 12. Each of the combination grooves 12 includes a through hole 121 and a long through groove 122 communicating the through hole 121. At least one side of the long through groove 122 away from the through hole 121 is provided with at least one positioning recess 1221. Preferably, two opposite sides of the long through groove 122 are respectively provided with a plurality pairs of positioning recesses 1221, and the plurality pairs of positioning recesses 1221 are linearly arranged in pairs and are formed as wavy shape, but not limited thereto.

In one preferred embodiment of the present disclosure, the plate body 11 is a rectangle plate, and the combination grooves are provided on four corners of the plate body 11. The positioning element 20 and the fixing element 30 are respectively and correspondingly connected to each combination groove 12.

Figure 3:
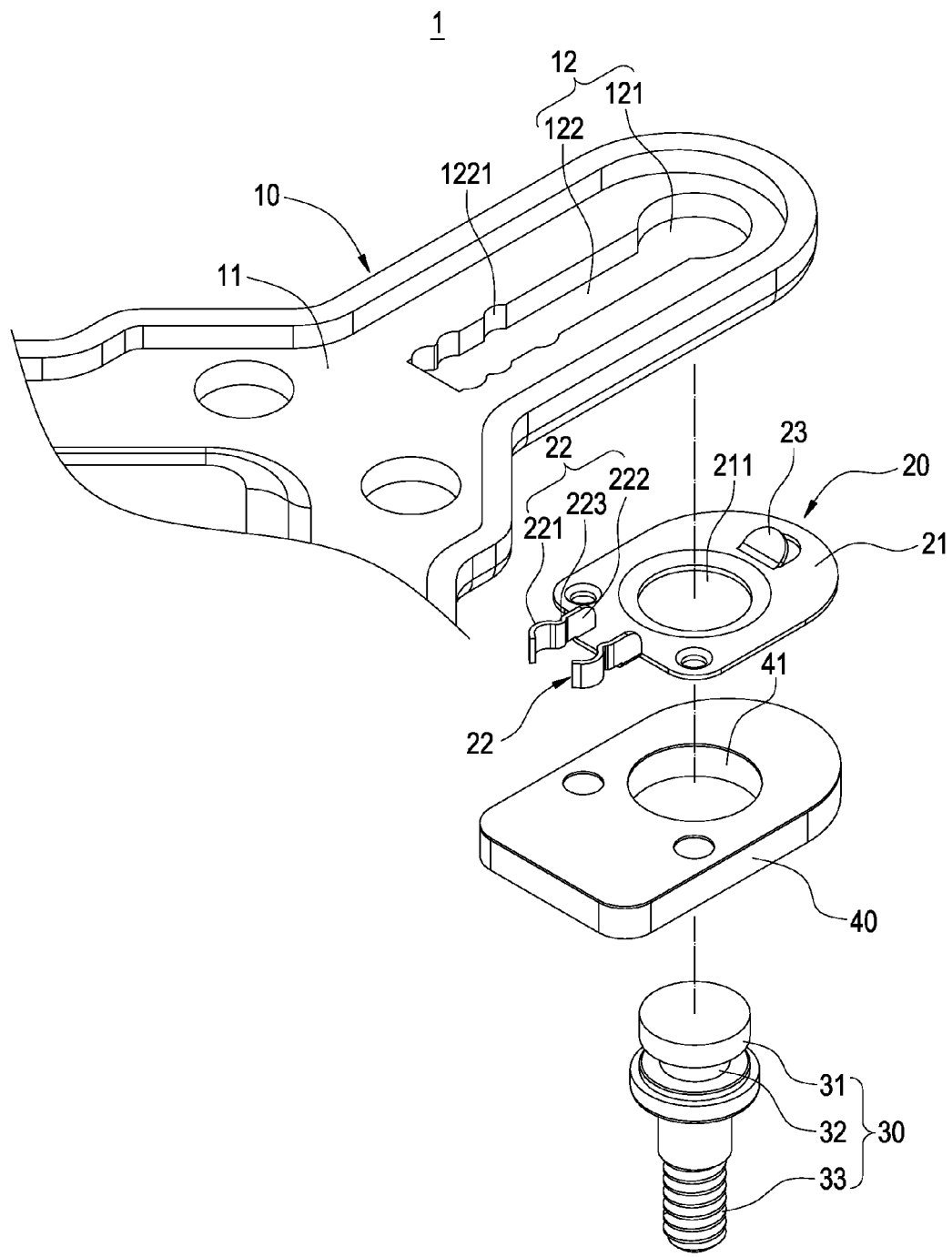
FIG. 3 is a partial exploded perspective view of a preferred embodiment of the adjustable fastening bracket used in a radiator according to the present disclosure.
Figure 4:
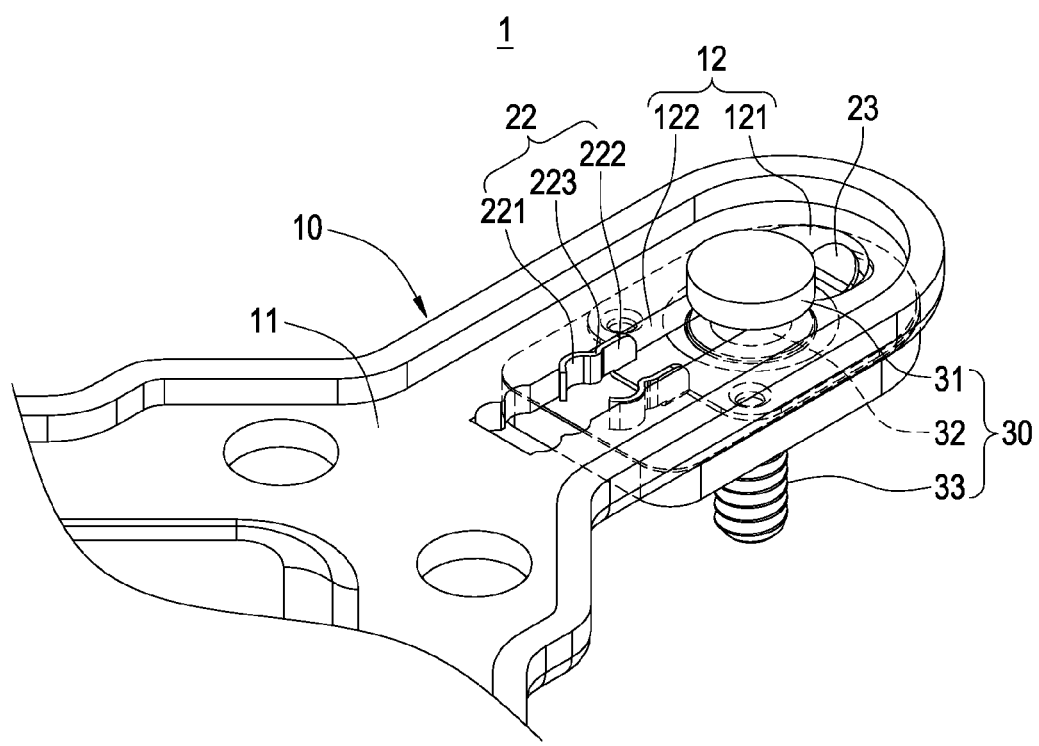
FIG. 4 is a partial magnified view of a preferred embodiment of the adjustable fastening bracket used in a radiator after being assembled according to the present disclosure.

As embodied in FIG. 3 according to the present disclosure, each positioning element 20 includes a positioning plate 21 and a pair of elastic arms 22 connecting the positioning plate 21. A penetrating hole 211 is provided on the positioning plate 21 corresponding to the through hole 121, and each elastic arm 22 has a positioning convex part 221. More specifically, each elastic arm 22 further comprises a fixing part 222 connecting the positioning plate 21 and a bending part 223 extending from the fixing part 222. The bending part 223 connects the fixing part 222 and the positioning convex part 221. Moreover, the positioning convex part 221 is formed as hook shape, and a bending direction of the bending part 223 is opposite to another bending direction of the positioning convex part 221. By this design, the elastic arm 22 has better elastic and deformation force.

Furthermore, each fixing element 30 penetrates the penetrating hole 211 and the through hole 121 to be disposed in each of the combination grooves 12. And then, each fixing element 30 drives the pair of elastic arms 22 to move from the through hole 121 toward a direction of the at least one positioning recess 1221, thereby the positioning convex part 221 of the pair of the elastic arms 22 clipping into any one of the positioning recesses 1221.

In the present preferred embodiment, each fixing element 30 includes a head portion 31 and a neck portion 32 connected to the head portion 31. The dimension of the head portion is smaller than the diameter of the through hole 121 and larger than the width of the long through groove 122. The fixing element 30 penetrates through the penetrating hole 211 and the through hole 121 by the head portion 31, and moves within the long through groove 122 by the neck portion 32. The fixing position of the fixing element 30 relative to the supporting stand 10 can be determined by adjusting the position where the positioning convex part 221 of the pair of elastic arms 22 clip on one set of the positioning recesses.

Preferably, the adjustable fastening bracket 1 further comprises a supporting plate 40. The supporting plate 40 is provided on a bottom of the positioning element 20 and has a via hole 41 corresponding to the penetrating hole 211 of the positioning plate 21, and the fixing element 30 sequentially penetrates the via hole 41, the penetrating hole 211, and the through hole 121 to be accommodated in each of the combination grooves 12. In on preferred embodiment of the present disclosure, the positioning plate 21 and the supporting plate 40 are connected to each other by gluing means, but not limited thereto.

Figure 5:
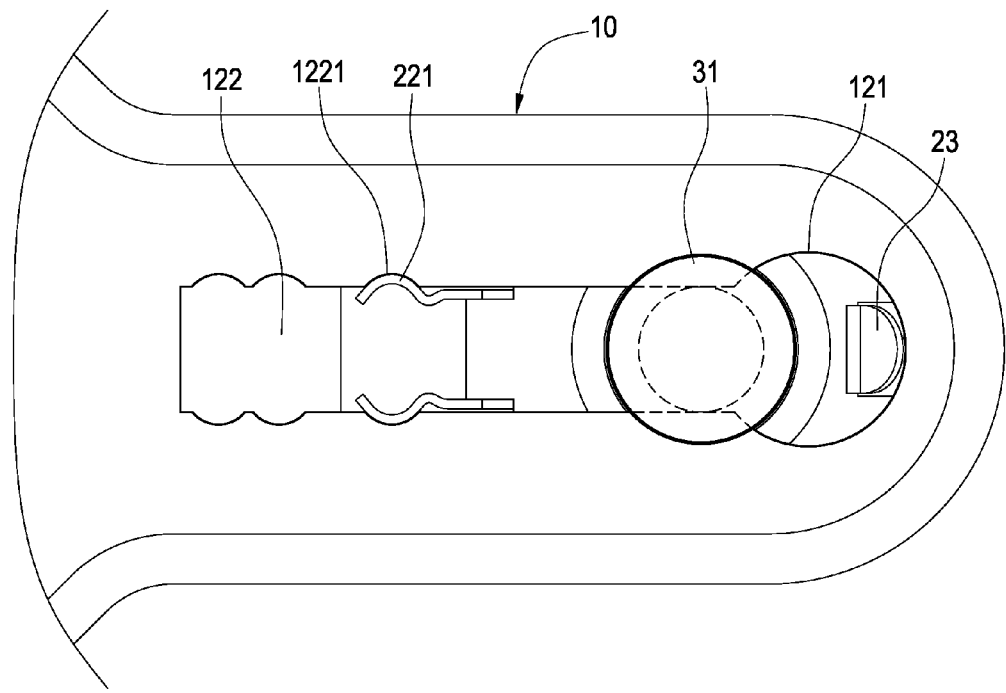
FIG. 5 is a partial plane view of the adjustable fastening bracket used in a radiator according to a preferred embodiment of the present disclosure.
Figure 6:
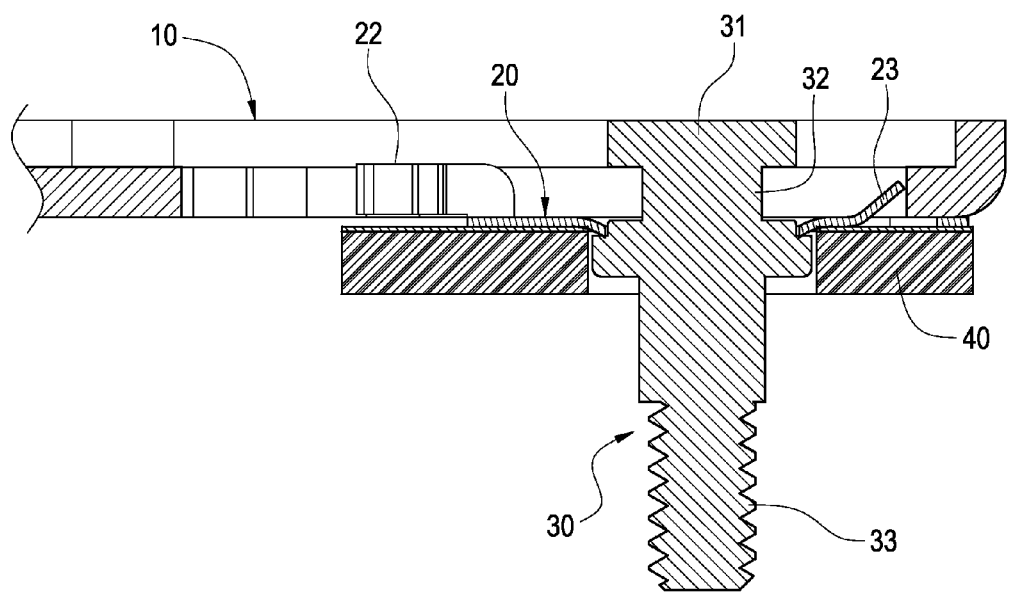
FIG. 6 is a partial assembly sectional view of the adjustable fastening bracket used in a radiator according to a preferred embodiment of the present disclosure.
Figure 7:
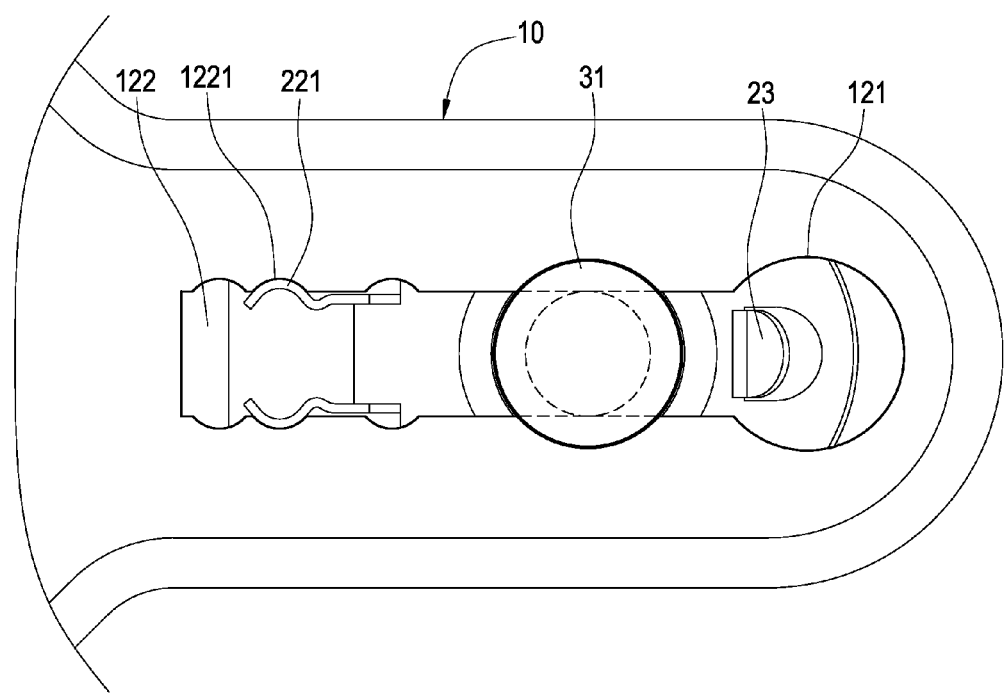
FIG. 7 is a positioning schematic view of the adjustable fastening bracket used in a radiator according to a preferred embodiment of the present disclosure.

Referring to FIGS. 5 to 7, in the preferred embodiment of the present disclosure, each of the positioning elements 20 further comprises a buckle 23. The buckle 23 is disposed on one side of the penetrating hole 211 and protruded to a surface of the positioning plate 21. When each fixing element 30 penetrates the penetrating hole 211 and the through hole 121 to be accommodated in each combination groove 12, the buckle 23 is against one side of the through hole 121 to allow the fixing element 30 to penetrate and be accommodated in the through hole 121. Thus, the fixing element 30 will not be dropped out of the through hole 121, preventing the missing or dropping of the fixing element 30 during the assembly or position-adjusting procedure.

Figure 8:
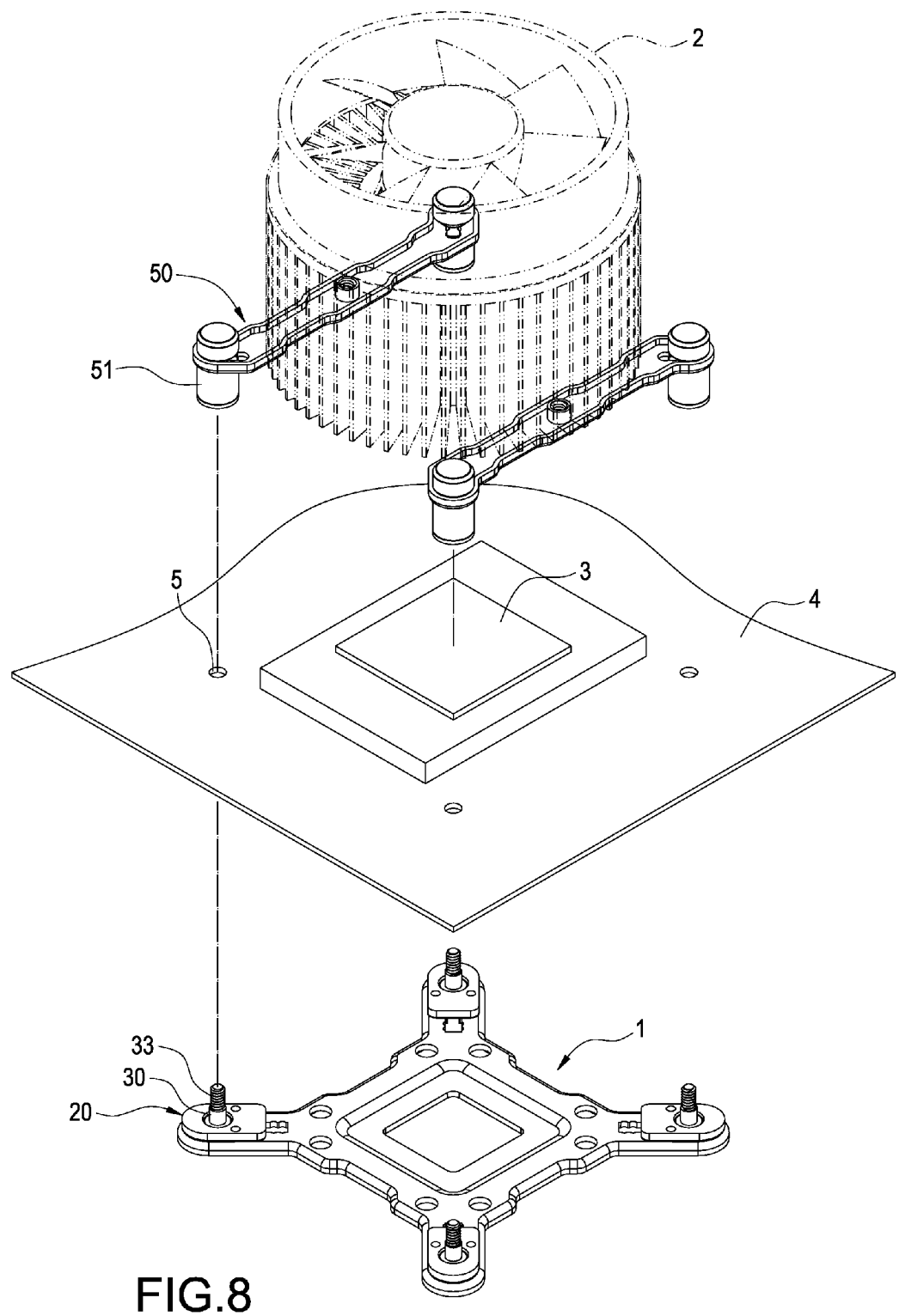
FIG. 8 is a using schematic diagram of the adjustable fastening bracket used in a radiator according to a preferred embodiment of the present disclosure.

Referring to FIG. 8, the adjustable fastening bracket 1 used in a radiator 2 fixes the radiator 2 and dissipates heat of an electronic element 3. When using the adjustable fastening bracket 1, the positioning element 20 and the fixing element 30 are respectively connected to the combination groove 12 of the supporting stand 10, and then the supporting stand 10 is connected to the electronic element 3 in a corresponding position. In the preferred embodiment of the present disclosure, the electronic element 3 is a central processing unit (CPU) disposed on a circuit board 4, and a plurality of openings 5 are provided around the periphery of the electronic element 3 on the circuit board 4. Besides, The adjustable fastening bracket 1 further includes a fastening bracket 50 with a plurality of screw posts 51 provided thereon. The radiator 2 is connected to the fastening bracket 50. Each fixing element 30 further includes a threaded portion 33 connecting the neck portion 32 (Please refer to FIG. 3).

When the adjustable fastening bracket 1 is fixed to the circuit board 4, the position of the fixing element 30 needs to be adjusted according to the position of the opening 5. Therefore, each fixing element 30 is clipped to one set of the positioning recesses 1221 by the positioning convex part 221 of the pair of the elastic arms 22 (Please refer to FIGS. 3 and 4). Finally, each fixing element 30 is fixed onto each screw post 51 to further be fastened to the fastening bracket 50 by the threaded portion 33. By this arrangement, the radiator 2 can be connected to a predetermined position (opening 5) on the circuit board 4 by the adjustable fastening bracket 1, and the goal of dissipating heat of the electronic element 3 by the radiator 2 can be achieved as well.

Although the present disclosure has been described with reference to the foregoing preferred embodiments, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. An adjustable fastening bracket for attachment to a radiator, the adjustable fastening bracket comprising:
   a supporting stand including a plate body, the plate body being provided with a plurality of combination grooves, each of the plurality of the combination grooves including a through hole and a long through groove communicating the through hole, at least one side of the long through groove away from the through hole being provided with at least one positioning recess;

a plurality of positioning elements, each of the plurality of positioning elements including a positioning plate and a pair of elastic arms connecting the positioning plate, a penetrating hole being provided on the positioning plate corresponding to the through hole, each of the pair of the elastic arms having a positioning convex part;

a plurality of fixing elements, each of the plurality of fixing elements penetrating the penetrating hole and the through hole to be disposed in each of the combination grooves, each of the plurality of fixing elements driving the pair of elastic arms to move from the through hole toward a direction of the at least one positioning recess, thereby the positioning convex part of the pair of the elastic arms clipping into the at least one positioning recess, wherein each of the plurality of fixing elements includes a head portion and a neck portion connected to the head portion, and the plurality of the fixing elements penetrate through the penetrating hole and the through hole by the head portion, and move within the long through groove by the neck portion; and a fastening bracket having a plurality of screw posts, each of the fixing elements comprising a threaded portion connecting the neck portion, each of the fixing elements being screwed onto each of the plurality of screw posts by the threaded portion to be fixed to the fastening bracket.

2. The adjustable fastening bracket according to claim 1, wherein the plate body is a rectangle plate, and the plurality of combination grooves are provided on four corners of the plate body.

3. The adjustable fastening bracket according to claim 1, wherein two opposite sides of the long through groove are respectively provided with a plurality pairs of the at least one positioning recesses.

4. The adjustable fastening bracket according to claim 3, wherein the plurality pairs of at least one positioning recesses are linearly arranged in pairs and are formed as wavy shape.

5. An adjustable fastening bracket for attachment to a radiator, the adjustable fastening bracket comprising:

a supporting stand including a plate body, the plate body being provided with a plurality of combination grooves, each of the plurality of combination grooves including a through hole and a long through groove communicating the through hole, at least one side of the long through groove away from the through hole being provided with at least one positioning recess;

a plurality of positioning elements, each of the plurality of positioning elements including a positioning plate and a pair of elastic arms connecting the positioning plate, a penetrating hole being provided on the positioning plate corresponding to the through hole, each of the pair of the elastic arms having a positioning convex part;

a plurality of fixing elements, each of the plurality of fixing elements penetrating the penetrating hole and the through hole to be disposed in each of the combination grooves, each of the plurality of fixing elements driving the pair of elastic arms to move from the through hole toward a direction of the at least one positioning recess, thereby the positioning convex part of the pair of the elastic arms clipping into the at least one positioning recess, wherein each of the positioning elements further comprises a buckle, the buckle is disposed on one side of the penetrating hole and protruded to a surface of the positioning plate, the buckle is against one side of the through hole to allow the plurality of fixing elements to penetrate and be accommodated in the through hole.

6. The adjustable fastening bracket according to claim 1, wherein each of the pair of elastic arms further comprises a fixing part connecting the positioning plate and a bending part extending from the fixing part, the bending part connects the fixing part and the positioning convex part.

7. The adjustable fastening bracket according to claim 6, wherein the positioning convex part is formed as hook shape, and a bending direction of the bending part is opposite to another bending direction of the positioning convex part.

8. An adjustable fastening bracket for attachment to a radiator, the adjustable fastening bracket comprising:

a supporting stand including a plate body, the plate body being provided with a plurality of combination grooves, each of the plurality of combination grooves including a through hole and a long through groove communicating the through hole, at least one side of the long through groove away from the through hole being provided with at least one positioning recess;

a plurality of positioning elements, each of the plurality of positioning elements including a positioning plate and a pair of elastic arms connecting the positioning plate, a penetrating hole being provided on the positioning plate corresponding to the through hole, each of the pair of the elastic arms having a positioning convex part;

a plurality of fixing elements, each of the plurality of fixing elements penetrating the penetrating hole and the through hole to be disposed in each of the combination grooves, each of the plurality of fixing elements driving the pair of elastic arms to move from the through hole toward a direction of the at least one positioning recess, thereby the positioning convex part of the pair of the elastic arms clipping into the at least one positioning recess; and a supporting plate, the supporting plate being provided on a bottom of the positioning element and having a via hole corresponding to the penetrating hole of the positioning plate, and each of the plurality of the fixing elements sequentially penetrating the via hole, the penetrating hole, and the through hole to be accommodated in each of the combination grooves.

9. The adjustable fastening bracket according to claim 5, wherein the plate body is a rectangle plate, and the plurality of combination grooves are provided on four corners of the plate body.

10. The adjustable fastening bracket according to claim 5, wherein two opposite sides of the long through groove are respectively provided with a plurality pairs of the at least one positioning recesses.

11. The adjustable fastening bracket according to claim 10, wherein the plurality pairs of at least one positioning recesses are linearly arranged in pairs and are formed as wavy shape.

12. The adjustable fastening bracket according to claim 5, wherein each of the pair of elastic arms further comprises a fixing part connecting the positioning plate and a bending part extending from the fixing part, the bending part connects the fixing part and the positioning convex part.

13. The adjustable fastening bracket according to claim 12, wherein the positioning convex part is formed as hook shape, and a bending direction of the bending part is opposite to another bending direction of the positioning convex part.

14. The adjustable fastening bracket according to claim 8, wherein the plate body is a rectangle plate, and the plurality of combination grooves are provided on four corners of the plate body.

15. The adjustable fastening bracket according to claim 8, wherein two opposite sides of the long through groove are respectively provided with a plurality pairs of at least one positioning recesses.

16. The adjustable fastening bracket according to claim 15, wherein the plurality pairs of at least one positioning recesses are linearly arranged in pairs and are formed as wavy shape.

17. The adjustable fastening bracket according to claim 8, wherein each of the pair of elastic arms further comprises a fixing part connecting the positioning plate and a bending part extending from the fixing part, the bending part connects the fixing part and the positioning convex part.

18. The adjustable fastening bracket according to claim 17, wherein the positioning convex part is formed as hook shape, and a bending direction of the bending part is opposite to another bending direction of the positioning convex part.

* * * * *